(12) United States Patent
Shirokawa et al.

(10) Patent No.: US 10,121,592 B2
(45) Date of Patent: Nov. 6, 2018

(54) DIELECTRIC THIN FILM AND ELECTRONIC COMPONENT

(71) Applicant: TDK CORPORATION, Tokyo (JP)

(72) Inventors: Maiko Shirokawa, Tokyo (JP); Raitarou Masaoka, Tokyo (JP); Hiroki Uchiyama, Tokyo (JP); Shohei Fujii, Tokyo (JP)

(73) Assignee: TDK CORPORATION, Tokyo (JP)

( * ) Notice: Subject to any disclaimer, the term of this patent is extended or adjusted under 35 U.S.C. 154(b) by 30 days.

(21) Appl. No.: 15/459,609

(22) Filed: Mar. 15, 2017

(65) Prior Publication Data

US 2017/0278632 A1    Sep. 28, 2017

(30) Foreign Application Priority Data

Mar. 22, 2016 (JP) ................... 2016-056793

(51) Int. Cl.
*B32B 15/04* (2006.01)
*H01G 4/10* (2006.01)
(Continued)

(52) U.S. Cl.
CPC ............. *H01G 4/10* (2013.01); *C04B 35/053* (2013.01); *C23C 14/082* (2013.01); *H01G 4/1209* (2013.01); *H01G 4/33* (2013.01); *H01P 7/10* (2013.01); *H03H 1/00* (2013.01); *C23C 14/3414* (2013.01); *H01B 3/12* (2013.01); *H01G 4/12* (2013.01); *H03H 2001/0021* (2013.01)

(58) Field of Classification Search
CPC ..................................................... B32B 15/04

USPC .......................................... 428/688, 689, 702
See application file for complete search history.

(56) References Cited

U.S. PATENT DOCUMENTS

| 2005/0082982 | A1* | 4/2005 | Kim | ................... H01J 9/02 313/587 |
| 2005/0134178 | A1* | 6/2005 | Kim | ................... H01J 11/12 313/587 |

(Continued)

FOREIGN PATENT DOCUMENTS

| JP | H05-47213 A | 2/1993 |
| KP | 10-1997-0060571 | 8/2001 |
| KR | 10-1997-0060571 | 8/2001 |

OTHER PUBLICATIONS

Jeong Soo Lee et al., "Texture and cross-sectional microstructure of MgO films grown on silicon dioxide by electron-beam evaporation," Thin Solid Films 354 (1999), 82-26.

*Primary Examiner* — Lauren R Colgan
(74) *Attorney, Agent, or Firm* — Oliff PLC

(57) ABSTRACT

A dielectric thin film containing MgO as a main component, wherein the dielectric thin film is composed of a columnar structure group containing at least one columnar structure A constructed by single crystal and at least one columnar structure B constructed by polycrystal, respectively, and in the cross section of the direction perpendicular to the dielectric thin film, when the area occupied by the columnar structure A is set as $C_A$ and the area occupied by the columnar structure B is set as $C_B$, the relationship between $C_A$ and $C_B$ satisfies $0.4 \leq C_B/C_A \leq 1.1$.

4 Claims, 2 Drawing Sheets

(51) Int. Cl.

| | |
|---|---|
| *H01P 7/10* | (2006.01) |
| *H03H 1/00* | (2006.01) |
| *C23C 14/08* | (2006.01) |
| *C04B 35/053* | (2006.01) |
| *H01G 4/33* | (2006.01) |
| *H01G 4/12* | (2006.01) |
| *C23C 14/34* | (2006.01) |
| *H01B 3/12* | (2006.01) |

(56) References Cited

U.S. PATENT DOCUMENTS

| | | | | |
|---|---|---|---|---|
| 2007/0103076 A1* | 5/2007 | Kim | ......................... | H01J 11/12 313/582 |
| 2009/0045744 A1* | 2/2009 | Park | ......................... | H01J 9/02 313/582 |
| 2009/0256478 A1* | 10/2009 | Kawasaki | ................. | H01J 9/02 313/582 |

* cited by examiner

DIELECTRIC THIN FILM AND ELECTRONIC COMPONENT

The present invention relates to a dielectric thin film and an electronic component comprising the dielectric thin film having a small dielectric loss and an excellent thermal shock resistance.

BACKGROUND

In order to cope with the requirements in the communication with a further high-speed and large capacity of mobile communication devices typified by smart phones and tablets, the MIMO technology (Multi-Input Multi-Output) using multiple frequency bands at the same time is beginning to be put into practical use. If the frequency bands used for communication increase, high frequency components are required for each frequency band respectively. Thus, in order to increase the number of the components while maintaining the equipment size, further miniaturization and higher functionality of each component is required.

As such electronic components corresponding to the high frequency, there are components such as a diplexer, a band pass filter or the like. They are all constituted by a combination of dielectric materials functioning as capacitors and magnetic materials functioning as inductors. However, it is required to suppress the losses respectively under a high frequency region in order to obtain a good high frequency property.

Regarding to the dielectric materials, in order to improve the selectivity of frequency, the dielectric loss is required to be small, that is, the Q value is required to be high. Many technologies have been disclosed on materials having low dielectric loss, among them, it is known that a material containing MgO has a low dielectric loss even under a high frequency band (2 GHz), that is, the Q value is high. Thus, the material containing MgO is one of the materials which are highly expected as dielectric materials used in a high frequency band.

Patent Document 1 discloses a technique relating to a dielectric thin film having a composition represented by a formula of $xTiO_2 \cdot yBaO \cdot zMgO$ with an average film thickness of the dielectric thin film of 0.1 μm to 10 μm. A good temperature property and a high Q value can be realized by controlling x, y and z.

PATENT DOCUMENTS

Patent Document 1: JP H05-47213

SUMMARY

As described in Patent Document 1, the dielectric thin film containing MgO as a main component has excellent characters with an excellent temperature property and a high Q value. However, in a case of a rapid temperature change, for example, when the temperature is rapidly raised from −55° C. to 125° C. or rapidly decreased reversely, there will be a problem that structural defects such as cracks are likely to happen in the dielectric thin film and it will be an urgent task to ensure a high thermal shock resistance. In the technique disclosed in Patent Document 1, there is no technique disclosed for suppressing structural defects such as cracks which is a problem.

The present invention has been made in accordance with the above situations and aims to provide a dielectric thin film and an electronic component comprising the dielectric thin film, wherein the dielectric thin film contains MgO as a main component and has a low dielectric loss (i.e., maintaining a high Q value) and a high thermal shock resistance against a rapid temperature change.

In order to solve the above problem and achieve the aims, the dielectric thin film according to the present invention comprises MgO as a main component, wherein the dielectric thin film is composed of a columnar structure group containing at least one columnar structure A constructed by single crystal and at least one columnar structure B constructed by polycrystal, respectively, and in the cross section of the direction perpendicular to the dielectric thin film, when the area occupied by the columnar structure A is set as $C_A$ and the area occupied by the columnar structure B is set as $C_B$, the relationship between $C_A$ and $C_B$ satisfies $0.4 \leq C_B/C_A \leq 1.1$.

By forming a dielectric thin film having the columnar structures having the above characteristics using materials containing MgO as the main component, and further controlling the area ratio ($C_B/C_A$) between columnar structure A and columnar structure B, a dielectric thin film can be provided which have an excellent thermal shock resistance while maintaining a high Q value. Also, an electronic component comprising the dielectric thin film can be provided with a low dielectric loss and a high thermal shock resistance.

Further, by using the dielectric thin film according to the present invention, it is possible to provide an electronic component such as a dielectric resonator or a dielectric filter or the like which can withstand the temperature change since the dielectric thin film according to the present invention has a higher Q value (i.e., showing a higher S/N ratio) and further has a higher thermal shock resistance comparing to the dielectric thin film conventionally used for high frequency electronic components.

According to the present invention, a dielectric thin film and an electronic component using the dielectric thin film can be provided, wherein the dielectric thin film contains MgO as a main component and has a low dielectric loss (i.e., maintaining a high Q value) and a high thermal shock resistance against a rapid temperature change.

DETAILED DESCRIPTION OF EMBODIMENTS

Hereinafter, the preferable embodiments of the present invention will be described with reference to the drawings.
(Thin Film Capacitor 10)

Figure 1:
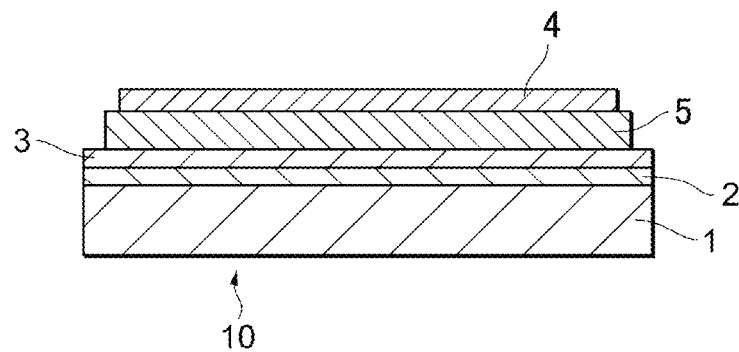
FIG. 1 is a sectional view of a thin film capacitor in one embodiment of the present invention.

FIG. 1 is a sectional view of thin film capacitor 10 as an example of the dielectric thin film element in one embodiment of the present invention. Thin film capacitor 10 is provided with lower electrode 3, upper electrode 4 and dielectric thin film 5 disposed between lower electrode 3 and upper electrode 4, which are laminated on the surface of substrate 1. Foundation layer 2 is provided between substrate 1 and lower electrode 3 to enhance the adhesion between substrate 1 and lower electrode 3. Further, substrate 1 has a function of guaranteeing the mechanical strength of the whole thin film capacitor 10.

The shape of the thin film capacitor is not particularly restricted and is usually rectangular. Also, its size is not particularly restricted. The thickness or the length can be appropriately set in accordance with the uses.

(Substrate 1)

There is no particular restriction on the material for forming substrate 1 as shown in FIG. 1. For instance, single crystal such as single crystal Si, single crystal SiGe, single crystal GaAs, single crystal InP, single crystal $SrTiO_3$, single crystal MgO, single crystal $LaAlO_3$, single crystal $ZrO_2$, single crystal $MgAl_2O_4$ and single crystal $NdGaO_3$, or ceramic polycrystalline substrate such as polycrystal $Al_2O_3$, polycrystal ZnO and polycrystal $SiO_2$, or substrate of metal such as Ni, Cu, Ti, W, Mo, Al, Pt or the like or the alloy thereof can form substrate 1, but there is no particular restriction. Among these materials, the single crystal Si is usually used as substrate 1 from the viewpoint of the low cost and good processabilities. The resistivity of substrate 1 varies depending on the material of the substrate. When a kind of material having a low resistivity is used as the substrate, the current leakage to the substrate side will affect the electric properties of thin film capacitor 10 if such a substrate is directly used. Thus, sometimes an insulating treatment can be provided to the surface of substrate 1 so as to prevent the current in use from flowing to substrate 1. For example, when single crystal Si is used as substrate 1, the surface of substrate 1 can be oxidized to form an insulating layer of $SiO_2$. Alternatively, insulating layers of $Al_2O_3$, $SiO_2$, $Si_3N_x$ or the like can be formed on the surface of substrate 1. The material for the insulating layer or the thickness of the film is not restricted as long as substrate 1 can be kept insulated. However, the film thickness is preferred to be 0.01 μm or more. A thickness less than 0.01 μm cannot guarantee the insulation and thus is not preferred as the thickness of the insulating layer. There is no particular restriction for the thickness of substrate 1 as long as the mechanical strength of the whole thin film capacitor can be ensured. For example, the thickness can be set to be 10 μm to 5000 μm. When the thickness is thinner than 10 μm, sometimes the mechanical strength cannot be ensured. On the other hand, if the thickness is thicker than 5000 μm, it cannot contribute to the downsizing of the electronic component.

(Foundation Layer 2)

In the present embodiment, thin film capacitor 10 shown in FIG. 1 preferably has foundation layer 2 on the surface of substrate 1 having been subjected to the insulating treatment. Foundation layer 2 is inserted for the purpose of improving the adhesion between substrate 1 and lower electrode 3. For example, Cr is usually inserted as foundation layer 2 when Cu is used in lower electrode 3 and Ti is usually inserted as foundation layer 2 when Pt is used as lower electrode 3.

It is not restricted to the materials exemplified above because it is intended to improve the adhesion. In addition, foundation layer 2 can be omitted if the adhesion between substrate 1 and lower electrode 3 can be guaranteed.

(Lower Electrode 3)

The material for forming lower electrode 3 is not particularly restricted as long as it has conductivity. For instance, lower electrode 3 can be formed by metals such as Pt, Ru, Rh, Pd, Ir, Au, Ag, Cu, Ni and the like or their alloy or the conductive oxide thereof. In this respect, the material can be selected in accordance with the cost or the atmosphere during the thermal treatment for dielectric thin film 5. In addition to air, the thermal treatment to dielectric thin film 5 can also be performed under an inert gas such as $N_2$ or Ar or a mixed gas of inert gas(es) and reductive gas $H_2$. The film thickness of lower electrode 3 is not particularly restricted as long as lower electrode 3 can function as an electrode. Further, the thickness is preferred to be 0.01 μm or more. A thickness less than 0.01 μm is not preferable because the conduction property will deteriorate in that case. In addition, when a substrate formed by using Cu or Ni, Pt or the like or a conductive oxide material (which can be utilized as an electrode) is used as substrate 1, foundation layer 2 and lower electrode 3 mentioned above can be omitted.

A thermal treatment can be performed following the formation of the lower electrode 3 so as to improve the adhesion between foundation layer 2 and lower electrode 3 and also to improve the stability of lower electrode 3. When a thermal treatment is performed, the heating rate of the temperature is preferably 10° C./min to 2000° C./min, and more preferably 100° C./min to 1000° C./min. The holding temperature during the thermal treatment is preferably 400° C. to 800° C., and the holding time is preferred to be 0.1 hour to 4.0 hours. If any parameter goes beyond the ranges mentioned above, the adhesion will not be good and the surface of lower electrode 3 will be uneven so that the dielectric properties of dielectric thin film 5 is likely to deteriorate.

(Dielectric Thin Film 5)

Dielectric thin film 5 is characterized in that it comprises MgO as a main component, wherein the dielectric thin film is composed of columnar structure groups which contains at least one of columnar structure A which is constructed by single crystals and at least one of columnar structure B which is constructed by polycrystals, and in the cross section of the direction perpendicular to the dielectric thin film, when the area occupied by the columnar structure A is set as $C_A$ and the area occupied by the columnar structure B is set as $C_B$, the relationship between $C_A$ and $C_B$ satisfies $0.4 \leq C_B/C_A \leq 1.1$.

Herein, the columnar structure which is one of the characters of the present invention will be described.

Figure 2A:
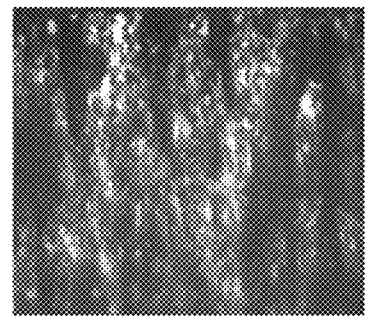
FIG. 2A is a TEM dark field image of the cross section of the dielectric thin film prepared in Example 7 of the present invention.
Figure 2B:
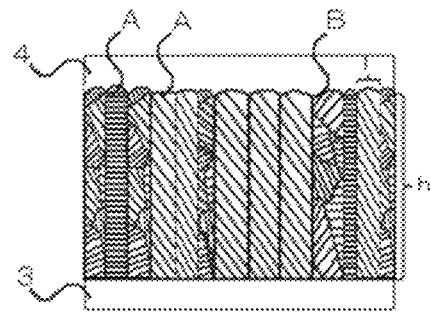
FIG. 2B is a schematic view of FIG. 2A.

As shown in FIG. 2B, the columnar structure of the present invention mean a columnar structure composed of a single crystal which is a single crystallite long in the thickness direction of the dielectric thin film wherein the single crystallite contacts with lower electrode 3 and upper electrode 4, or a columnar structure composed of polycrystals, when the cross section of the dielectric thin film is observed using a TEM bright-field image. Further, the columnar structure of the present invention extends along the normal direction of the substrate surface or a direction in a range of ±5° relative to the normal direction over the whole dielectric thin film, and the ratio of h to 1 described in FIG. 2B (i.e., the aspect ratio) satisfies $17<(h/1)<40$.

In a dielectric thin film containing MgO as a main component, when only the columnar structure constructed by single crystal is provided, that is, in the case of only the columnar structure A of the present invention, both in the cases of the barium titanate type and the lead titanate type which are widely used in the world, there will be a problem that structural defects such as cracks are easily to occur due to a rapid temperature change which generally does not cause a problem even if they have the same structure. As one of the reasons, it can be exemplified that the columnar structure constructed by single crystal containing MgO as a main component has a large thermal expansion and thermal contraction for a rapid temperature change.

Therefore, in the present invention, it is considered that, the dielectric thin film is composed of a columnar structure group containing not only a columnar structure constructed by single crystal (hereinafter, referred to as a columnar structure A) but also a columnar structure constructed by polycrystal (hereinafter, referred to as a columnar structure B). Thereby, when the columnar structure A is thermal expanded or thermal contracted, the columnar structure B exhibiting different thermal expansion and thermal contraction from that of the columnar structures A will become a barrier, and the thermal expansion and the thermal contraction of the columnar structure A accompanying a rapid temperature change can be alleviated.

Further, in the dielectric thin film 5, in the cross section of the direction perpendicular to the dielectric thin film, the area ratio $C_B/C_A$ between the area $C_A$ occupied by the columnar structure A and the area $C_B$ occupied by the columnar structure B satisfies the relationship of $0.4 \leq C_B/C_A \leq 1.1$. By controlling the area ratio $C_B/C_A$ in this range, the thermal expansion and the thermal contraction of the columnar structure A can be more efficiently alleviated, a dielectric thin film and an electronic component comprising the same can be provided in which a high Q value is maintained and a high thermal shock resistance is provided.

On the other hand, even if the dielectric thin film containing MgO as a main component is a columnar structure group including at least one columnar structure A and at least one columnar structure B, respectively, when the area ratio $C_B/C_A$ between the area $C_A$ of the structure A and the area $C_B$ of the columnar structure B does not satisfy the relationship of $0.4 \leq C_B/C_A \leq 1.1$ in a cross section of the direction perpendicular to the dielectric thin film, a high Q value and a high thermal shock resistance cannot be obtained both at the same time easily.

When the $C_B/C_A$ is larger than 1.1, that is, the area ratio of the columnar structure B in the columnar structure group is higher, since the columnar structure B is constructed by polycrystal, there will be many grain boundaries existing. Further, the crystal grain boundary refers to the interface between the crystallite and the crystallite constituting the columnar structure B. In the crystal grain boundary, dielectric loss tends to increase due to lattice distortions, lattice defects, dislocations and the like. Therefore, when the area ratio of the columnar structure B increases, it becomes difficult to maintain a high Q value.

In addition, in the present invention, it has been confirmed that there is no large decrease in dielectric loss as long as $C_B/C_A$ is 1.1 or less even in a range where the area of the columnar structure B in the columnar structure group is larger than the columnar structure A (i.e., in a range in which $C_B/C_A$ exceeds 1.0). Although there are many unclear points about the reasons, it is considered that it was possible to suppress the decrease in dielectric loss to a wider range than expected by using a dielectric thin film having a columnar structure group like the present invention.

On the other hand, when the $C_B/C_A$ is less than 0.4, that is, when the area ratio of the columnar structure B in the columnar structure group is low, the action of alleviating the thermal expansion and the thermal contraction of the columnar structure A accompanying a rapid temperature change is difficult to be obtained. As a result, it tends to be difficult to obtain an effect of suppressing structural defects such as cracks. Therefore, in order to achieve both low dielectric loss and excellent thermal shock resistance, it is required that the area ratio $C_B/C_A$ between the columnar structure A and the columnar structure B should satisfy the relationship of $0.4 \leq C_B/C_A \leq 1.1$.

As described above, by having the characteristic features of the present invention, it is possible to realize excellent thermal shock resistance while maintaining low dielectric loss. That is, even it is a dielectric thin film whose main component is MgO, the effect of the present invention cannot be obtained in a dielectric thin film or an electronic component without the columnar structure group having the features of the present invention.

Further, as a preferred embodiment of the present invention, at least two columnar structures B are present, and the columnar structure B is a columnar structure including at least one columnar structures $B^+$ with one or more triple junctions, and it is preferred that the columnar structure $B^+$ is included in an amount of 50% or more of the area $C_B$ occupied by the columnar structure B.

The columnar structure $B^+$ with one or more triple junctions tends to be less likely to cause thermal expansion or thermal contraction due to a rapid temperature change inside the columnar structure than the columnar structure B without a triple conjunction. Thereby, the columnar structure $B^+$ with triple junction(s) becomes a stronger barrier to the columnar structure A. By providing the columnar structures $B^+$ in an amount of 50% or more of the area $C_B$ occupied by the columnar structure B, it is possible to bring out a barrier effect more effectively, so that the thermal expansion and thermal contraction of the columnar structure A due to thermal shock or the like can be further alleviated. As a result, a higher thermal shock resistance can be obtained.

The thickness of dielectric thin film 5 is preferably 10 nm to 2000 nm, and more preferably 50 nm to 1000 nm. If the thickness is less than 10 nm, the dielectric breakdown is likely to happen. When the thickness exceeds 2000 nm, the area of the electrode needs to be broadened so as to increase the electrostatic capacity in thin film capacitor 10, and it may be hard to downsize depending on the designs of the electronic component. In the measurement of the thickness of the dielectric thin film, the dielectric thin film can be excavated by a FIB (Focused Ion Beam) processing device, and then the obtained cross section is observed by an SIM (Scanning Ion Microscope) or the like to measure the length.

Dielectric thin film 5 is preferably formed by various methods for film-forming such as vacuum evaporation method, sputtering method, PLD (Pulsed Laser Deposition method), MO-CVD (Metal-Organic Chemical Vapor Deposition method), MOD (Metal Organic Decomposition method) or Sol-Gel method, CSD (Chemical Solution Deposition method) or the like. Sometimes a trace of impurities or subcomponents may be contained in the raw material in use (the deposition material, various target materials, organometalic material and etc.), but no particular problem will arise even if they are contained as long as they will not significantly deteriorate the insulation properties.

A trace of impurities or subcomponents may be contained in prepared dielectric thin film 5 as long as they do not significantly deteriorate the dielectric loss (the Q value) which is one of the effects of the present invention. As the subcomponent, for example, there are BaO or $Ta_2O_5$ or the like. The amount of the main component as the balance is not particularly restricted. For example, the amount of the main component is 50% or more and 100% or less, preferably 75% or more and 100% or less relative to the whole dielectric composition comprising the main component.

In addition, dielectric thin film 5 usually only consists of the dielectric composition of the present invention which contains MgO as the main component, but it can also be a laminated structure in combination with thin films made of other dielectric compositions. For example, by making into a laminated structure with the conventional amorphous dielectric films or the crystalline films such as $Si_3N_x$, $SiO_x$, $Al_2O_x$, $ZrO_x$, $Ta_2O_x$ or the like, the thermal shock resistance of dielectric thin film 5 can be further improved.

(Upper Electrode 4)

In one example of the present embodiment, thin film capacitor 10 is provided with upper electrode 4 on the surface of dielectric thin film 5, wherein upper electrode 4 functions as another electrode in thin film capacitor 10. The material for forming upper electrode 4 is not particularly restricted as long as it is conductive. Upper electrode 4 can be formed by the same material as that of lower electrode 3. The thickness of upper electrode 4 is not particularly restricted as long as the function as an electrode can be exerted, and the thickness is preferred to be 10 nm or more. A film thickness of 10 nm or less is not preferable for upper electrode 4 because the conductivity will deteriorate in that case.

In the embodiment mentioned above, a thin film capacitor is exemplified as an example of the electronic component using the dielectric thin film involved in one embodiment of the present invention. However, the electronic component using the dielectric thin film of the present invention is not limited to the thin film capacitor and also can be any electronic component having a dielectric thin film such as a diplexer, a band-pass filter, a balun or a coupler.

Next, a method of manufacturing thin film capacitor 10 of the present embodiment will be described.

First, foundation layer 2 made of Ti is deposited, for example, by a sputtering method, on Si substrate 1 whose surface is thermally oxidized.

Next, Pt is deposited as lower electrode 3 on foundation layer 2 made of Ti, for example, by a sputtering method.

Next, a precursor of dielectric thin film 5 is formed on lower electrode 3 made of Pt. The precursor of dielectric thin film 5 can be formed by various film forming methods such as vacuum deposition method, sputtering method, PLD (Pulse Laser Deposition method), MO-CVD (Metal Organic Chemical Vapor Deposition method), MOD (Metal Organic Decomposition method), sol-gel method, CSD (Chemical Solution Deposition method) or the like.

In the case of the sputtering method, a precursor of the dielectric thin film 5 is formed on the lower electrode 3 by using a target having a desired composition. The condition is set as follows, that is, Ar is used as the atmosphere, the pressure is preferably 0.1 Pa to 50 Pa, the high frequency power is preferably 500 W to 3000 W, and the substrate temperature is preferably from room temperature to 600° C.

This forming condition becomes an important point for controlling the fine structure of dielectric thin film 5. The area ratio between the columnar structure A and the columnar structure B, which is a character of the present invention, is controlled by the substrate temperature, the high frequency power and the Ar pressure. In addition, the triple junction inside the column of the columnar structure B, which is a preferred character of the present invention, is controlled by the high frequency power, the Ar pressure and the heat treatment described below.

Dielectric thin film 5 was heat treated in $N_2$ atmosphere. The conditions are set as follows, that is, the holding temperature is preferably 300° C. to 450° C., the holding time is preferably 0.5 hour to 1.0 hour, the heating rate to the holding temperature is preferably 10° C./min to 50° C./min. The heat treatment is also one of important parameters for controlling the triple junctions inside the column of the columnar structure B.

Further, a Pt thin film is formed on the obtained dielectric thin film 5 as upper electrode 4 by, for example, a sputtering method, to obtain thin film capacitor 10.

Although the embodiment of the present invention has been described above, the present invention is not limited to the above-described embodiment at all, and various modifications can be made without departing from the purpose of the present invention.

EXAMPLES

Hereinafter, the present invention will be further described based on detailed Examples, but the present invention is not limited to these Examples.

First, a Si wafer with a thickness of 600 μm was heat-treated in a dried atmosphere of oxidative gas to form a $SiO_2$ film with a thickness of 600 nm to obtain a substrate. A Ti thin film as a foundation layer was formed on the substrate by a sputtering method so as to have a thickness of 20 nm.

Next, a Pt thin film as the lower electrode was formed on the formed Ti thin film mentioned above by sputtering method so as to have a thickness of 100 nm.

The formed Ti/Pt thin film was subjected to a thermal treatment under ordinary pressure in oxygen atmosphere with a heating rate of 400° C./min and a holding temperature of 700° C. and a temperature holding time of 30 minutes.

The sputtering method was used in the deposition of the dielectric thin film. The targets necessary in the formation of the dielectric thin film were prepared as follow.

First, MgO which was the main component of Samples No. 1 to No. 17 shown in Table 1 was weighed. The weighed raw material powder, together with water and $ZrO_2$ beads of φ2 mm were put into a wide-mouth poly-pot and then subjected to wet mixing for 20 hours. Then, the slurry of the mixed powder was dried at 100° C. for 20 hours. The obtained mixed powder was put into a crucible made of $Al_2O_3$ and the calcination was performed in atmospheric air at 1250° C. for 5 hours to provide the calcinated MgO powder.

An aqueous solution of PVA (i.e., polyvinyl alcohol) with a concentration of 6 wt % was added into the resultant calcinated powder as a binder in an amount of 4 wt % relative to the calcinated powder to prepare a granulated powder. Then, the granulated powder was added into a mold of φ7 inch to provide a thickness of about 15 mm. Then, a molded compact was obtained by using a uniaxial pressing machine. The condition for molding is set with the pressure being $2.0 \times 10^8$ Pa and the temperature being room temperature.

After that, a binder removal treatment was provided to the resultant molded compact in atmospheric air under ordinary pressure with a heating rate of 100° C./hour and a holding temperature of 400° C. and a temperature holding time of 4 hours. Then, a sintering process was performed in atmospheric air under ordinary pressure with a heating rate of 200° C./hour and a holding temperature of 1600° C. to 1700° C. and a temperature holding time of 12 hours.

Next, the obtained sintered compact was ground on both surfaces by using a cylindrical grinding machine until its thickness became 10 mm, thereby a target for sputtering necessary in the formation of the dielectric thin film was obtained.

The target made from the MgO mentioned above was used to deposit a film by a sputtering method to form a dielectric thin film with a thickness of 400 nm on the Pt lower electrode in an Ar atmosphere under a condition with the pressure, the high frequency power, and the film formation temperature (substrate temperature) being controlled as shown in Table 1 for each sample. After that, dielectric thin films having various structures were formed according to the heat treatment conditions described in Samples No.1 to No. 17 as shown in Table 1.

Thereafter, a vapor deposition apparatus was used to form an Pt thin film as the upper electrode on the resultant dielectric thin film. The shape of the upper electrode was formed to have a diameter of 100 μm and a thickness of 60 nm by using a metal mask, thereby obtaining the thin film capacitor samples of Sample No.1 to Sample No.17 shown in FIG. 1.

With regard to the obtained thin film capacitor samples, dielectric loss, thermal shock resistance, cross section evaluation of the dielectric thin film and quantitative method thereof were respectively measured by the following methods.

<Dielectric Loss>

Dielectric loss was measured for the thin film capacitor sample at a reference temperature of 25° C. using an RF impedance/material analyzer (4991 A, manufactured by Agilent Technologies) at a frequency of 2 GHz and an input signal level (measuring voltage) of 0.5 Vrms. Here, the evaluation was carried out with the Q value represented by the reciprocal of the dielectric loss (tan δ). The Q value is preferred to be high, and a value of 700 or more is preferable. (The higher the Q value was, means the lower the dielectric loss was.)

<Thermal Shock Resistance>

The thin film capacitor samples were subjected to a thermal shock test. The thermal shock test was a test to evaluate the resistance to temperature change by applying a temperature difference between a high temperature and a low temperature to a thin film capacitor sample repeatedly. Specifically, the thin film capacitor sample was exposed to an environmental change of −55° C.⇔+125° C. for 30 minutes in one cycle to evaluate the durability against a sudden change in temperature. The evaluation standard was to evaluate that the change rate with respect to the initial capacitance was within ±3%, the insulation resistance value was not decreased by two orders of magnitude with respect to the initial insulation resistance value and the appearance was not abnormal. The thermal shock resistance was judged by the number of thermal cycles. In the present invention, 1000 cycles or more was regarded as good.

<Cross Section Evaluation of the Dielectric Thin Film and Quantitative Method>

For the dielectric thin film, the film thickness was measured by the following method. That was, the dielectric thin film was excavated in the film thickness direction by a FIB (Focused Ion Beam) processing device, and then the obtained cross section was observed by a TEM (Transmission Electron Microscope) to measure the length. The analysis of the microstructure was carried out by TEM and it was performed in a field of view with 10 or more column boundaries between the columnar structure A and the columnar structure B.

In the field of view mentioned above, the diffraction wave of the preferred orientation plane in the following X-ray diffraction pattern was used to perform a TEM dark field image observation. In the present example, MgO (111) was selected.

For the determination of the preferred orientation plane, the dielectric thin film was measured by X-ray diffraction (parallel beam method) to obtain a diffraction pattern. A Cu-Kα ray was used as an X-ray source, and the measurement conditions were set with a voltage of 45 kV, a current of 40 mA and a range of 2θ=20° to 80°. Regarding the orientation of the dielectric thin film, the intensity ratios of the peak with the highest intensity to the MgO (200) peak in the obtained diffraction pattern were compared, and the orientation showing a ratio (the highest peak intensity/MgO (200)) of 1.5 or more is defined as the preferred orientation plane.

Figure 3A:
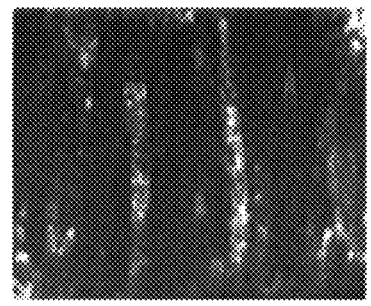
FIG. 3A is a TEM dark field image of the cross section of the dielectric thin film prepared in Comparative Example 6 of the present invention.
Figure 3B:
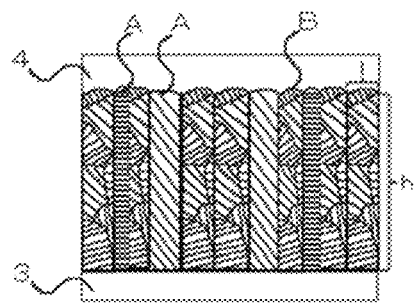
FIG. 3B is a schematic view of FIG. 3A.

The method for distinguishing the columnar structure A from the columnar structure B was as follows. An image obtained by binarizing the TEM dark field image of the film cross section in the above field of view and a TEM bright field image of the same field of view were prepared. In the image subjected to a binarizing process, the portion which was the preferred orientation plane as shown in FIG. 2A or FIG. 3A was a white bright portion, and the portion other than the preferred orientation plane will become a black dark portion. As the threshold value of binarization, a value of ⅓ of the average luminance contrast of the film cross section TEM bright field image within one field of view was set.

First, regarding the columnar structure B, when the white bright portion is 1% or more and less than 80% in one columnar structure, it was judged as a columnar structure B consisting of polycrystal.

Figure 4:
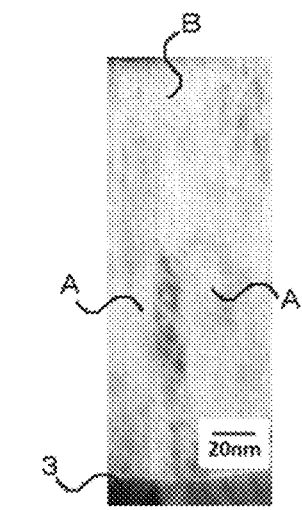
FIG. 4 is a TEM bright field image of the cross section of the dielectric thin film prepared in Example 4 of the present invention.

Next, as the columnar structure A, there were two kinds of structures including columnar structure A1 constructed by single crystal composed of the preferred orientation plane and columnar structure A2 constructed by single crystal composed of the orientation plane other than the preferred orientation plane. In the binarized image, a columnar structure in which 80% or more of one columnar structure were white bright portions was defined as a columnar structure A1 constructed by single crystal composed of the preferred orientation plane. Further, in the binarized image, after a columnar structure was confirmed in which the white bright portion in one columnar structure is 0% (i.e., the whole is a black dark portion), the presence or absence of grain boundaries was confirmed inside the columnar structure at the same location by using a bright field image observed in the same field of view as shown in FIG. 4. A columnar structure determined to have no grain boundary was defined as a columnar structure A2 constructed by single crystal composed of the orientation plane other than the preferred orientation plane. In the present invention, the columnar structure A1 and the columnar structure A2 were both represented as the columnar structure A consisting of single crystal.

The area ratio between the columnar structure A and the columnar structure B was calculated by measuring the area occupied by the columnar structure A and the area occupied by the columnar structure B shown above and calculating the area ratio ($C_B/C_A$).

Figure 5:
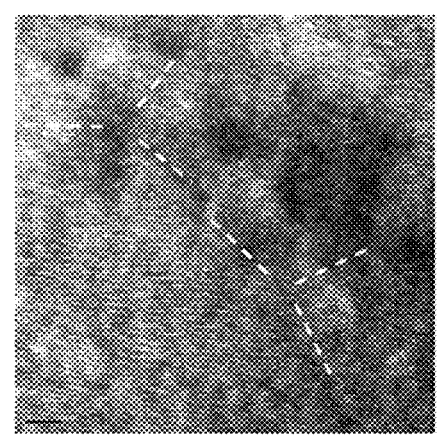
FIG. 5 is a high-resolution TEM image of the cross section of the dielectric thin film prepared in Example 4 of the present invention.

Further, the presence or absence of the columnar structure B$^+$ with triple junction(s) was judged by using a high-resolution TEM image (hereinafter, referred to as a lattice image) of the film cross section in the field of view. As shown in FIG. 5, the lattice image shows a periodic contrast corresponding to the periodic structure of the crystal, and it is possible to confirm the orientation in which the microstructure is oriented.

The film formation conditions, the heat treatment conditions, the cross section analysis results, the electric characteristics measurement results, and the thermal shock test measurement results of Sample No. 1 to sample No. 17 were shown in Table 1.

TABLE 1

| | | Thermal treatment conditions | | | | | |
|---|---|---|---|---|---|---|---|
| | | Temperature for film formation [° C.] | Holding temperature [° C.] | Holding time [hr] | Heating rate [° C./min] | Power [W] | Pressure [Pa] |
| Sample No. 1 | Comparative example 1 | 25 | — | — | — | 1500 | 50 |
| Sample No. 2 | Comparative example 2 | 600 | — | — | — | 500 | 0.5 |
| Sample No. 3 | Comparative example 3 | 25 | 450 | 1 | 10 | 2000 | 0.1 |
| Sample No. 4 | Comparative example 4 | 25 | 300 | 1 | 10 | 2000 | 0.1 |
| Sample No. 5 | Comparative example 5 | 25 | — | — | — | 2000 | 0.1 |
| Sample No. 6 | Comparative example 6 | 25 | — | — | — | 1500 | 0.2 |
| Sample No. 7 | Comparative example 7 | 25 | 300 | 1 | 10 | 1500 | 0.2 |
| Sample No. 8 | Example 1 | 25 | 450 | 1 | 10 | 1500 | 0.2 |
| Sample No. 9 | Example 2 | 100 | — | — | — | 1500 | 0.2 |
| Sample No. 10 | Example 3 | 100 | 300 | 1 | 10 | 1500 | 0.2 |
| Sample No. 11 | Example 4 | 100 | — | — | — | 1500 | 0.5 |
| Sample No. 12 | Example 5 | 100 | 450 | 1 | 10 | 1500 | 0.5 |
| Sample No. 13 | Example 6 | 200 | — | — | — | 1500 | 0.2 |
| Sample No. 14 | Example 7 | 200 | 450 | 1 | 10 | 1000 | 0.5 |
| Sample No. 15 | Example 8 | 200 | — | — | — | 1000 | 0.2 |
| Sample No. 16 | Example 9 | 200 | — | — | — | 1000 | 0.5 |
| Sample No. 17 | Comparative example 8 | 200 | 300 | 1 | 10 | 500 | 0.5 |

| | Analysis of the cross section | | | | | | Number of |
|---|---|---|---|---|---|---|---|
| | Columnar structure group | Columnar structure A | Columnar structure B | Area ratio $C_B/C_A$ | Columnar structure $B^+$ | ratio [%] | Q value | thermal cycles |
| Sample No. 1 | x | — | — | — | — | — | 494 | 1150 |
| Sample No. 2 | ○ | ○ | x | — | — | — | 1480 | 370 |
| Sample No. 3 | ○ | x | ○ | — | ○ | 75 | 430 | 2700 |
| Sample No. 4 | ○ | x | ○ | — | ○ | 10 | 545 | 2450 |
| Sample No. 5 | ○ | x | ○ | — | x | — | 583 | 2320 |
| Sample No. 6 | ○ | ○ | ○ | 2.0 | ○ | 75 | 644 | 2600 |
| Sample No. 7 | ○ | ○ | ○ | 1.3 | ○ | 75 | 670 | 2450 |
| Sample No. 8 | ○ | ○ | ○ | 1.1 | ○ | 75 | 720 | 2200 |
| Sample No. 9 | ○ | ○ | ○ | 0.8 | x | — | 840 | 1080 |
| Sample No. 10 | ○ | ○ | ○ | 0.8 | ○ | 10 | 821 | 1260 |
| Sample No. 11 | ○ | ○ | ○ | 0.8 | ○ | 75 | 797 | 1900 |
| Sample No. 12 | ○ | ○ | ○ | 0.6 | ○ | 75 | 864 | 1750 |
| Sample No. 13 | ○ | ○ | ○ | 0.5 | ○ | 75 | 1017 | 1620 |
| Sample No. 14 | ○ | ○ | ○ | 0.4 | ○ | 75 | 1129 | 1550 |
| Sample No. 15 | ○ | ○ | ○ | 0.4 | x | — | 1302 | 1010 |
| Sample No. 16 | ○ | ○ | ○ | 0.4 | ○ | 10 | 1230 | 1050 |
| Sample No. 17 | ○ | ○ | ○ | 0.3 | ○ | 75 | 1358 | 850 |

Further, "—" means that it was not existing or it could not be evaluated.

As shown in Table 1, it was confirmed that two kinds of columnar structures were observed, and in Examples 1 to 9 in which the area ratio between the columnar structure A and the columnar structure B was in the range of $0.4 \leq C_B/C_A \leq 1.1$, each of the thin film capacitor samples had a Q value as high as 700 or more and a high thermal shock resistance of 1000 cycles or more could be obtained.

Examples 2 to 4, Examples 7 to 9

As shown in Table 1, it was confirmed that the area ratio $C_B/C_A$ of the columnar structure A and the columnar structure B could be controlled by adjusting the film formation conditions and the heat treatment conditions, and the lower the area ratio $C_B/C_A$ was, i.e., the more the columnar structure A with single crystal was contained, the higher the Q value was. Further, refer to the number of the thermal cycles, the lower the area ratio $C_B/C_A$ was, the smaller the number of thermal cycles was. Thereby, the larger the area occupied by the columnar structure B, the higher the thermal shock resistance was.

Example 1

As shown in Table 1, it was confirmed that even in the range where $C_B/C_A$ was 1.1 in the area ratio $C_B/C_A$ of the columnar structure A and the columnar structure B and the columnar structure B was present more than the columnar structure A, a high Q value was maintained.

On the other hand, as shown in Table 1, in Comparative examples 1 to 8 which were out of the scope of the present invention, a high Q value and a high thermal shock resistance could not be obtained both at the same time.

Next, the investigated results of the effect of the columnar structure $B^+$ with triple junction(s) were shown in Table 2 in the case where the area ratio $C_B/C_A$ of $C_A$ and $C_B$ were the same, wherein the $C_A$ represented the area occupied by the columnar structure A and $C_B$ represented the area occupied by the columnar structure B. The thin film capacitor samples were prepared under the film formation conditions and the heat treatment conditions as shown in Table 2.

TABLE 2

| | | Thermal treatment conditions | | | | | |
|---|---|---|---|---|---|---|---|
| | | Temperature for film formation [° C.] | Holding temperature [° C.] | Holding time [hr] | Heating rate [° C./min] | Power [W] | Pressure [Pa] |
| Sample No. 10 | Example 3 | 100 | 300 | 1 | 10 | 1500 | 0.2 |
| Sample No. 18 | Example 10 | 100 | 300 | 0.5 | 50 | 1500 | 0.2 |
| Sample No. 19 | Example 11 | 100 | 450 | 1 | 10 | 1500 | 0.2 |
| Sample No. 20 | Example 12 | 100 | 450 | 0.5 | 50 | 1500 | 0.2 |
| Sample No. 11 | Example 4 | 100 | — | — | — | 1500 | 0.5 |
| Sample No. 21 | Example 13 | 100 | 450 | 0.5 | 50 | 1500 | 0.5 |

| | Analysis of the cross section | | | | | | |
|---|---|---|---|---|---|---|---|
| | Columnar structure group | Columnar structure A | Columnar structure B | Area ratio $C_B/C_A$ | Columnar structure $B^+$ | $B^+$ ratio [%] | Q value | Number of thermal cycles |
| Sample No. 10 | ○ | ○ | ○ | 0.8 | ○ | 10 | 821 | 1260 |
| Sample No. 18 | ○ | ○ | ○ | 0.8 | ○ | 25 | 790 | 1310 |
| Sample No. 19 | ○ | ○ | ○ | 0.8 | ○ | 45 | 818 | 1450 |
| Sample No. 20 | ○ | ○ | ○ | 0.8 | ○ | 55 | 802 | 1750 |
| Sample No. 11 | ○ | ○ | ○ | 0.8 | ○ | 75 | 797 | 1900 |
| Sample No. 21 | ○ | ○ | ○ | 0.8 | ○ | 90 | 780 | 2080 |

Examples 4, 12 and 13

As shown in Table 2, since a columnar structure $B^+$ was contained and the columnar structure $B^+$ was contained in an amount of 50% or more of the entire columnar structure B in the TEM image of the cross section, the thermal cycle number was 1,500 cycles or more, and a more excellent thermal shock resistance was obtained. This was considered that the barriers were increased for suppressing the expansion of the columnar structure A due to thermal shock or the like by having the columnar structure $B^+$ in an amount of 50% or more of the entire columnar structure B in the TEM image of the cross section, thus, the occurrence of cracks could be further suppressed and the thermal shock resistance was improved. Further, it was confirmed that as the ratio of the columnar structure $B^+$ increased, the number of the triple junctions inside the column of the columnar structure B also increased and a better thermal shock resistance was obtained.

Next, the effect of subcomponent was confirmed. Thin film capacitor samples having a dielectric thin film containing BaO and $Ta_2O_5$ as subcomponents in a composition having MgO as a main component was prepared and evaluated by the same way as in Example 1.

TABLE 3

| | | Main component | Subcomponent | | Analysis of the cross section | | | | | | |
|---|---|---|---|---|---|---|---|---|---|---|---|
| | | | | | Columnar | | | | Columnar structure | | Number of |
| | | MgO [mol %] | BaO [mol %] | $Ta_2O_5$ [mol %] | structure group | Columnar structure A | Columnar structure B | Area ratio $C_B/C_A$ | $B^+$ ratio [%] | Q value | thermal cycles |
| Sample No. 22 | Example 14 | 79.7 | 19.7 | 0.5 | ○ | ○ | ○ | 0.6 | 75 | 983 | 1800 |
| Sample No. 23 | Example 15 | 75.0 | 12.5 | 12.6 | ○ | ○ | ○ | 0.4 | 75 | 1249 | 1580 |

Example 14 and Example 15

From Table 3, it could be confirmed that even in the dielectric thin films containing MgO as the main component and BaO and $Ta_2O_5$ as the subcomponents, a columnar structure group including the columnar structure A and the columnar structure B which were characters of the present invention could be observed. And in the case where the area ratio between the columnar structure A and the columnar structure B is in the range of $0.4 \leq C_B/C_A \leq 1.1$, all of the samples showed a high Q value of 700 or more, and a high thermal shock resistance of 1000 cycles or more could be obtained. Thereby, it was confirmed that similar effects can be obtained even if MgO is contained as the main component and other subcomponents were contained.

As described above, the present invention relates to a dielectric thin film element such as a thin film capacitor having a dielectric thin film, and a dielectric thin film exhibiting good thermal shock resistance while maintaining a high Q value could be provided. Thereby, in a dielectric thin film element such as a thin film capacitor having a dielectric thin film, it can be downsized and provided with excellent functions. The present invention provides novel technologies for wide applications for thin film high frequency components such as a diplexer or a band-pass filter or the like.

DESCRIPTION OF REFERENCE NUMERALS

1 Substrate
2 Foundation layer
3 Lower electrode
4 Upper electrode
5 Dielectric thin film
10 Thin film capacitor
A Columnar structure A
B Columnar structure B

What is claimed is:

1. A dielectric thin film comprising MgO as a main component, wherein
    the dielectric thin film is composed of a columnar structure group containing at least one columnar structure A constructed by single crystal and at least one columnar structure B constructed by polycrystal, respectively, and
    in the cross section of the direction perpendicular to the dielectric thin film, when the area occupied by the columnar structure A is set as $C_A$ and the area occupied by the columnar structure B is set as $C_B$, the relationship between $C_A$ and $C_B$ satisfies $0.4 \leq C_B/C_A \leq 1.1$.

2. The dielectric thin film according to claim 1, wherein
    at least two columnar structures B are present, and the columnar structure B is a columnar structure including at least one columnar structure $B^+$ with one or more triple junctions, and
    the columnar structure $B^+$ is included in an amount of 50% or more of the area $C_B$ occupied by the columnar structure B.

3. An electronic component comprising the dielectric thin film according to claim 1.

4. An electronic component comprising the dielectric thin film according to claim 2.

* * * * *